(12) United States Patent
McCarthy

(10) Patent No.: US 6,346,461 B1
(45) Date of Patent: Feb. 12, 2002

(54) ELECTROLESS EPITAXIAL ETCHING FOR SEMICONDUCTOR APPLICATIONS

(75) Inventor: Anthony M. McCarthy, Menlo Park, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/570,888

(22) Filed: May 15, 2000

(51) Int. Cl.[7] .......................... H01L 21/20; H01L 21/44
(52) U.S. Cl. ...................... 438/479; 438/667; 438/483
(58) Field of Search .................. 438/145, 459, 438/667, 479, 482, 483, 166, 151, 152, 160

(56) References Cited

U.S. PATENT DOCUMENTS

| | | | |
|---|---|---|---|
| 4,905,067 A | * | 2/1990 | Morelli et al. ............... 357/48 |
| 5,401,995 A | * | 3/1995 | Lari et al. .................... 257/539 |
| 5,912,495 A | * | 6/1999 | Depetro et al. ............. 257/355 |

* cited by examiner

Primary Examiner—Michael S. Lebentritt
(74) Attorney, Agent, or Firm—L. E. Carnahan; Alan H. Thompson

(57) ABSTRACT

A method for fabricating thin-film single-crystal silicon on insulator substrates using electroless etching for achieving efficient etch stopping on epitaxial silicon substrates. Microelectric circuits and devices are prepared on epitaxial silicon wafers in a standard fabrication facility. The wafers are bonded to a holding substrate. The silicon bulk is removed using electroless etching leaving the circuit contained within the epitaxial layer remaining on the holding substrate. A photolithographic operation is then performed to define streets and wire bond pad areas for electrical access to the circuit.

21 Claims, 2 Drawing Sheets

ELECTROLESS EPITAXIAL ETCHING FOR SEMICONDUCTOR APPLICATIONS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to fabricating crystalline silicon microelectronic components, particularly to forming thin-film single-crystal silicon on insulator substrates, and more particularly to a method for fabricating thin-film single-crystal silicon on insulator substrates using electroless etching for achieving efficient etch stopping on epitaxial silicon substrates.

Single-crystal silicon in insulator substrates has been previously proposed as a solution to the problems facing the flat-panel display industry. Such prior efforts are exemplified by U.S. Pat. No. 5,399,231 issued Mar. 21, 1995; No. 5,414,276 issued May 9, 1995; and No. 5,674,758 issued Oct. 7, 1997, as well as copending application Ser. No. 08/871,709 filed Jun. 9, 1997, entitled "Silicon on Insulator Achieved Using Electrochemical Etching", assigned to the same assignee. These prior approaches to the above-referenced problems used strain dependent etch stops such as heavily boron doped silicon, SiGe:B, and SiGe layers. These provide excellent resistance to the etching of KOH and permit very fine control of the final silicon thin film thickness. The disadvantage of using these layers is that they are expensive and not commercially viable solutions to thinning wafers.

The present invention provides a solution to the above-referenced problems and takes advantage of the existing silicon substrates used in silicon fabrication facilities. Thus, there is no burden placed on the semiconductor manufacturer to take advantage of the method of the present invention. The method of this invention uses electroless etching for achieving efficient etch stopping on epitaxial silicon substrates for fabricating thin-film single-crystal silicon on insulator substrates. There are various applications for the substrate-thinned circuits produced by this method, including flat-panel displays.

SUMMARY OF THE INVENTION

It is an object of the present invention to provide a method for fabricating thin-film single-crystal silicon on insulator substrates.

A further object of the invention is to provide a fabrication method involving electroless epitaxial etching for producing substrate-thinned circuits.

Another object of the invention is to provide a method for producing microelectronic circuits and devices which utilize electroless etching for achieving efficient etch stopping on epitaxial silicon substrates.

Another object of the invention is to provide an improvement in the fabrication of thin-film single-crystal on insulator substrates using electroless etching for achieving efficient etch stopping on epitaxial silicon substrates.

Another object of the invention is to provide a fabrication method wherein microelectronic circuits and devices are prepared on epitaxial silicon wafers, the wafers are bonded to a holding substrate, the silicon bulk is removed using electroless etching leaving the circuits and devices contained within the epitaxial layer remaining on the holding substrate, and defining streets and wire bond pad areas for electrical access to the circuit via a photolithographic procedure.

Other objects and advantages of the present invention will become apparent from the following description and accompanying drawings. The present invention basically involves electroless epitaxial etching for semiconductor applications. More specifically, the present invention involves a method for fabricating thin-film single-crystal silicon on insulator substrates using electroless etching for achieving efficient etch stopping on epitaxial silicon substrates. The method of this invention eliminates the burden and expense previously used to form the etch stops, and provides a commercially viable solution to thinning wafers. After microelectronic circuits and devices are prepared on epitaxial silicon wafers in a standard fabrication facility, and the wafers are bonded to a holding substrate, the silicon bulk is removed using electroless etching leaving the circuits and devices contained within the epitaxial layer remaining on the holding substrate, and thereafter, via a photolithographic process, streets and wire bond pad areas are defined for electrical access to the circuit. The end product being substrate-thinned circuits produced by a commercially viable method which places no extra burden on the semiconductor manufacturer.

BRIEF DESCRIPTION OF THE DRAWINGS

The accompanying drawings, which are incorporated into and form a part of the disclosure, illustrate an embodiment of the substrate-thinned circuit produced by the method of the present invention as well as illustrating operational steps of the method and, together with the description, serve to explain the principles of the invention.

DETAILED DESCRIPTION OF THE INVENTION

The present invention is directed to electroless epitaxial etching for semiconductor applications. The method of this invention is for fabricating thin-film single-crystal silicon on insulator substrates using electroless etching for achieving efficient etch stopping on epitaxial silicon substrates. Microelectronic circuits and devices are prepared on epitaxial silicon wafers in a standard fabrication facility. The wafers are bonded to a holding substrate. The major portion of the silicon bulk is removed using electroless etching leaving the circuit contained within the epitaxial layer remaining on the holding substrate. A photolithographic step is performed to define streets and wire bond pad areas for electrical access to the circuit. There are various applications for these substrate-thinned circuits, including electrooptical devices.

Figure 1:
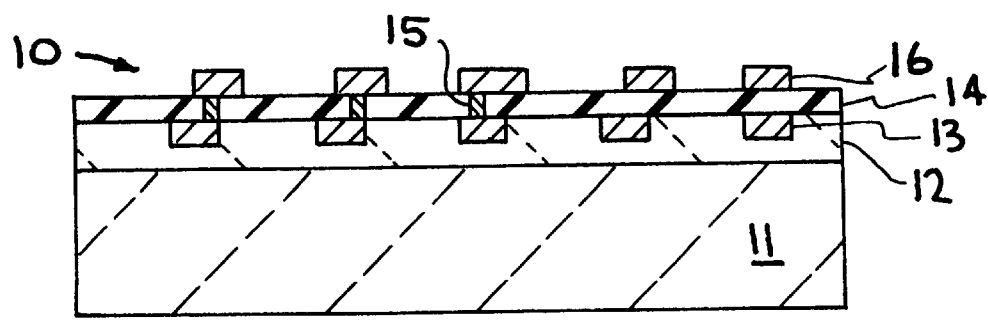
FIG. 1 is a cross-sectional view of a silicon wafer containing wells forming devices, such as transistors, in an epitaxial layer.

Referring now to the drawings, FIG. 1 illustrates a cross section of a component including a silicon wafer with electronic devices in simplified form for the purpose of illustrating the method of the present invention, and is generally indicated at 10. The component 10 includes a silicon wafer or substrate 11 with an epitaxial layer 12 which has wells 13 formed therein during the fabrication process. The wells 13 contain transistors, devices and circuits. These electric devices in wells 13 are isolated from connecting metal wires 16 by a dielectric layer 14. The devices in wells 13 are interconnected to the wires 16 through openings 15 in the dielectric layer 14, called contact holes.

Figure 2:
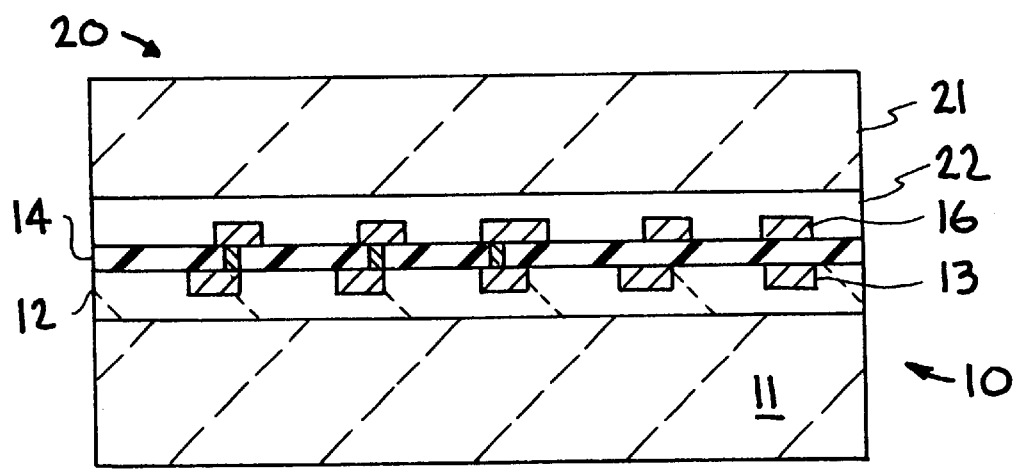
FIG. 2 shows the silicon wafer of FIG. 1 bonded to a supporting substrate.

As shown in FIG. 2, the component 10 of FIG. 1 is bonded to a supporting substrate 21 via an adhesive bonding layer 22 to form a bonded pair indicated at 20.

Figure 3:
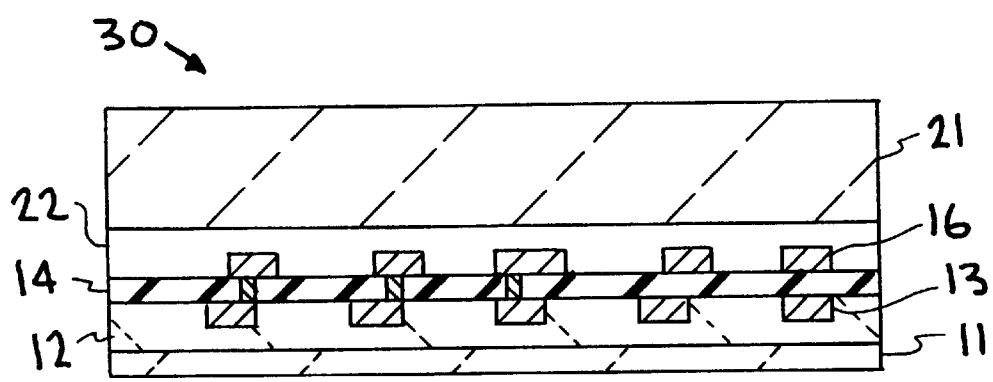
FIG. 3 is similar to FIG. 2 but with a major portion of the silicon substrate removed.

A reduced bonded pair indicated at 30 shown in FIG. 3, is formed by removing most of the silicon substrate or wafer 11 leaving 1–30 microns of silicon remaining close to the boundary with the epitaxial layer 12. This removal may be performed by grinding, polishing or wet or dry etching.

Figure 4:
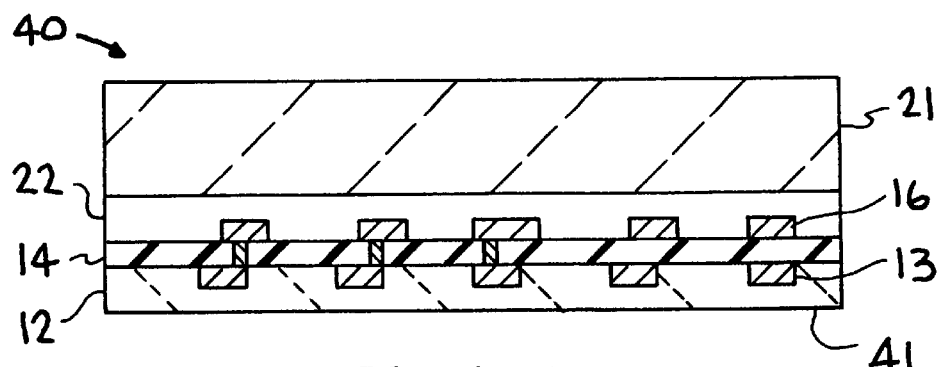
FIG. 4 illustrates an intermediate product wherein the remainder of the silicon substrate is removed and the epitaxial layer doped.

FIG. 4 illustrates an intermediate product indicated at 40 which is formed by selective etching of the silicon substrate or wafer 11 from the epitaxial layer 12 leaving exposed an outer surface 41 of the epitaxial layer 12. For this technique to work, it is necessary to ensure that there is a doping concentration difference between the epitaxial layer 12 and the silicon substrate or wafer 11. For a p-type epitaxy the layer concentration should be about $1\times10^{15}/cm^3$ to $5\times10^{16}/cm^3$ and the p-type substrate doping should exceed about $7\times10^{18}/cm^3$. For a n-type epitaxy the layer concentration should be about $1\times10^{15}/cm^3$ to about $5\times10^{16}/cm^3$ and the n-type substrate doping should exceed about $8\times10^{1}/cm^3$. The selective etching is performed according to the method of Muraoka et al, Semiconductor Silicon, Journal of the Electrochemical Society, 1973, pp. 327–338. This method uses a combination of 1:3:8 hydrofluoric acid, nitric acid, and glacial acetic acid.

Figure 5:
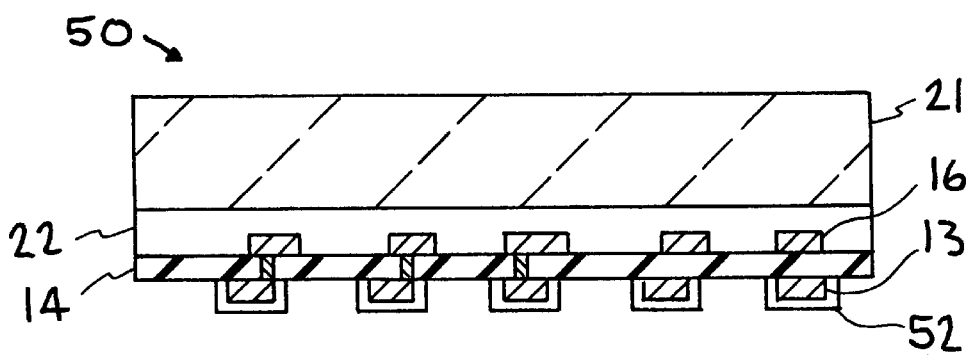
FIG. 5 illustrates the wafer of FIG. 3 following removal of the remainder of the silicon substrate, and selective etching of the epitaxial layer to form islands around the wells forming the transistors of FIG. 1.

As shown in FIG. 5, a partially transparent substrate indicated at 50 may be formed by continuing with a lithographic process to form islands 52 surrounding wells 13. A photoresist is applied to the surface 41 of FIG. 4 and patterned to permit etching of the epitaxial layer 12 into islands 52 which contain the wells 13.

Figure 6:
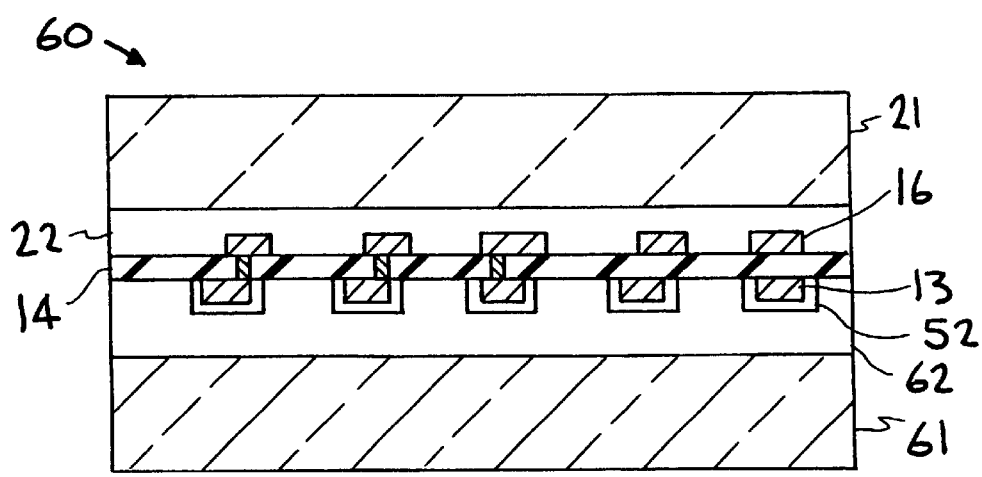
FIG. 6 illustrates the assembly of FIG. 5 modified to form an electrooptical device which includes a glass substrate spaced from the islands and liquid crystal material located around the islands.

An electrooptical device, indicated at 60 in FIG. 6, is formed using the partially transparent substrate 50 of FIG. 5 by bonding it to a glass substrate 61 using adhesive components, not shown, and permitting a gap between layers 14 and 61 to be filled with liquid crystal material 62.

It has thus been shown that the method of the present invention produces thin-film single-crystal silicon on insulator substrates using electroless etching for achieving efficient etch stopping on epitaxial silicon substrates. The method of the present invention takes advantage of the existing silicon substrates used in silicon fabrication facilities. Thus, there is no burden placed on the semiconductor manufacturer to take advantage of the process of this invention.

While particular embodiments and a particular sequence of operational steps and/or particular materials have been illustrated and/or described, to exemplify and teach the principles of the invention, such are not intended to be limiting. Modifications and changes may become apparent to those skilled in the art, and it is intended that the invention be limited only by the scope of the appended claims.

What is claimed is:

1. A method for fabricating thin-film single-crystal silicon on insulator devices, comprising:

providing a substrate comprising a silicon wafer having an epitaxial layer thereon in which is located at least one device containing well, a dielectric layer with at least one hole, on the epitaxial layer and at least one metal member on the dielectric layer electrically connected via the at least one hole to the at least one device containing well;

bonding a supporting substrate to the combination of the at least one metal member and the dielectric layer, and removing the silicon wafer.

2. The method of claim 1, additionally including removing the epitaxial layer except for at least one island around the at least one well.

3. The method of claim 2, additionally including bonding the substrate to a glass substrate so as to form a gap therebetween, and filling the gap with liquid crystal material.

4. The method of claim 1, additionally including providing the epitaxial layer with a p-type material having a concentration of about $1\times10^{15}/cm^3$ to $5\times10^{16}/cm^3$, and providing the silicon wafer with a p-type dopant having a concentration of greater than about $7\times10^{18}cm/^3$.

5. The method of claim 1, additionally including providing the epitaxial layer with an n-type material having a concentration of about $1\times10^{15}/cm^3$ to $5\times10^{16}/cm^3$, and providing the silicon wafer with an n-type dopant having a concentration of greater than about $8\times10^{18}/cm^3$.

6. The method of claim 1, wherein removing the silicon wafer is carried out using an electroless etchant having a combination of 1:3:8 hydrofluoric acid, nitric acid and glacial acetic acid.

7. The method of claim 1, wherein removing the silicon wafer is carried out by grinding, polishing, or wet or dry etching.

8. The method of claim 1, wherein bonding the supporting substrate to the dielectric layer is carried out via an adhesive bonding layer.

9. The method of claim 3, wherein bonding the substrate to a glass substrate is carried out using adhesive components.

10. The method of claim 1, additionally including forming the substrate by providing a silicon wafer, forming the epitaxial layer on the silicon wafer, forming device containing wells in the epitaxial layer, forming a dielectric layer over the device containing wells, forming contact holes in the dielectric layer, forming metal members on the dielectric layer, and connecting the metal members to the device containing wells.

11. A method of fabricating thin-film single-crystal silicon on an insulator substrate, comprising:

providing a silicon wafer, forming an epitaxial layer on the silicon wafer, forming device containing wells adjacent the surface of the epitaxial layer, forming a dielectric layer over the epitaxial layer and device containing wells, forming contact holes in the dielectric layer over the device containing wells, forming metal members on the dielectric layer, and connecting at least certain of the metal members to certain of the device containing wells.

12. The method of claim 11, additionally including bonding a supporting substrate to the combination of the metal members and the dielectric layer.

13. The method of claim 12, wherein the bonding is carried out using an adhesive bonding layer intermediate the combination of the metal members and the dielectric layer and the supporting substrate.

14. The method of claim 13, additionally including removing at least a portion of the silicon wafer.

15. The method of claim 13, additionally including removing all of the silicon wafer.

16. The method of claim 15, additionally including removing the epitaxial layer except for islands around the device containing wells.

17. The method of claim 16, additionally including attaching a glass substrate in spaced relation to the dielectric layer to form a gap therebetween, and filling the gap with liquid crystal material.

18. The method of claim 11, additionally including providing the epitaxial layer and the silicon wafer with material selected from p-type and n-type materials.

19. The method of claim 15, wherein removing the silicon wafer is carried out using an etchant containing a combination of 1:3:8 hydrofluoric acid, nitric acid, and glacial acetic acid.

20. The method of claim 2, additionally including bonding the substrate to a mechanical holding substrate.

21. The method of claim 3, wherein bonding the substrate to a glass mechanical holding substrate is carried out using adhesive components.

* * * * *